United States Patent
Lai

(10) Patent No.: US 8,455,280 B1
(45) Date of Patent: Jun. 4, 2013

(54) METHOD FOR MANUFACTURING LIGHT EMITTING DIODES

(75) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/457,565

(22) Filed: Apr. 27, 2012

(30) Foreign Application Priority Data

Mar. 28, 2012 (TW) ................................. 101110704

(51) Int. Cl.
  *H01L 21/00* (2006.01)
(52) U.S. Cl.
  USPC ..................................... 438/33; 257/E21.001
(58) Field of Classification Search
  USPC ............................................................ 438/33
  See application file for complete search history.

(56) References Cited

U.S. PATENT DOCUMENTS

| | | | | |
|---|---|---|---|---|
| 6,897,127 B2* | 5/2005 | Hanaoka | ........................ | 438/460 |
| 7,435,606 B2* | 10/2008 | Lee et al. | ........................ | 438/26 |
| 7,452,739 B2* | 11/2008 | Chu et al. | ........................ | 438/33 |
| 7,829,440 B2* | 11/2010 | Chu et al. | ........................ | 438/464 |
| 8,097,478 B2* | 1/2012 | Hodota | ........................... | 438/29 |
| 2007/0020789 A1* | 1/2007 | Lee et al. | ........................ | 438/22 |
| 2007/0077673 A1* | 4/2007 | Hwang et al. | ................... | 438/46 |
| 2008/0121908 A1* | 5/2008 | Yuan et al. | ...................... | 257/94 |
| 2008/0265265 A1* | 10/2008 | Xiong et al. | .................... | 257/97 |
| 2012/0088322 A1* | 4/2012 | Hsia et al. | ...................... | 438/29 |

* cited by examiner

*Primary Examiner* — Lex Malsawma
(74) *Attorney, Agent, or Firm* — Altis Law Group, Inc.

(57) ABSTRACT

An exemplary method for manufacturing LEDs includes steps: providing a substrate and an epitaxial layer formed on the substrate; etching the epitaxial layer along a transverse direction thereof to divide the epitaxial layer into separated LED chips, and a groove defined between each two adjacent LED chips; providing insulating poles and inserting the insulating poles in the grooves; printing a solder paste layer on a top surface of each LED chip away from the substrate; reflow soldering the LED chips to make the solder paste layers mounted on the LED chips become solder balls; releasing the substrate from the LED chips; etching the insulating poles until the insulating poles are totally removed and the LED chips are separated from each other; and providing metallic plates and respectively soldering the metallic plates on the solder balls of the LED chips.

18 Claims, 8 Drawing Sheets

METHOD FOR MANUFACTURING LIGHT EMITTING DIODES

BACKGROUND

1. Technical Field

The present disclosure relates to semiconductor devices and, more particularly, to a method for manufacturing light emitting diodes (LEDs).

2. Description of Related Art

LEDs have many beneficial characteristics, including low electrical power consumption, low heat generation, long lifetime, small volume, good impact resistance, fast response and excellent stability. These characteristics have enabled the LEDs to be widely used as a light source in electrical appliances and electronic devices.

A conventional method for manufacturing the LEDs includes the following steps, such as forming an epitaxial layer on a metallic plate, and severing the epitaxial layer and the metallic plate into a plurality of parts by laser to form a plurality of LEDs. However, it incurs a high cost to sever the metallic plate by laser.

What is needed is a method for manufacturing LEDs which can overcome the problem of the prior art.

DETAILED DESCRIPTION

A method for manufacturing a plurality of LEDs 100 (shown in FIG. 8) in accordance with an exemplary embodiment includes the following steps.

Figure 1:
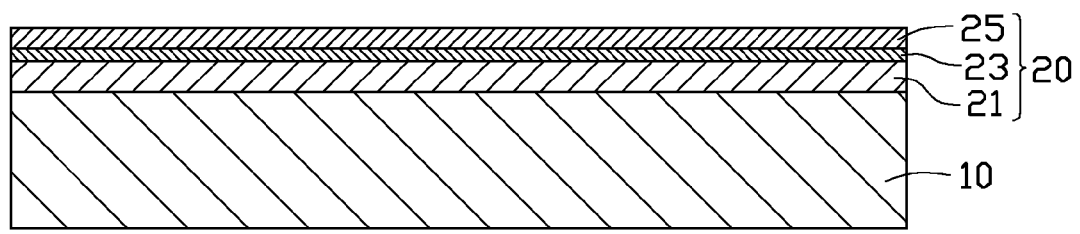
FIGS. 1-8 are views showing steps of a method for manufacturing LEDs in accordance with an exemplary embodiment of the present disclosure.

Referring to FIG. 1, the first step is providing a sapphire substrate 10 and an epitaxial layer 20 formed on a top side of the sapphire substrate 10. The epitaxial layer 20 includes an N-type semiconductor layer 21, an active layer 23 and a P-type semiconductor layer 25 arranged on the sapphire substrate 10 in sequence from bottom to top.

Figure 2:
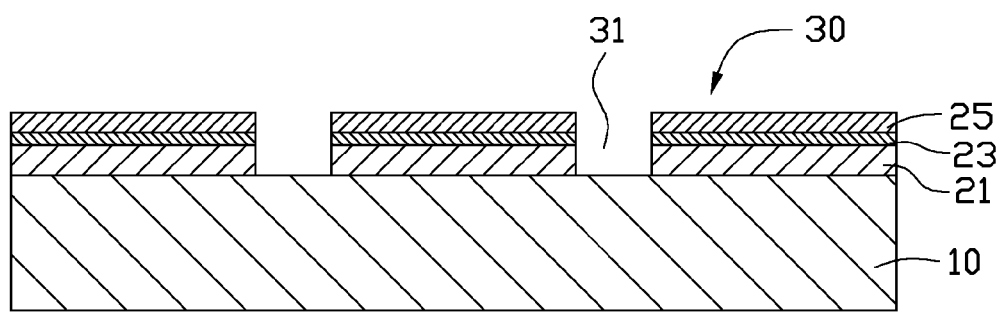

Referring to FIG. 2, the second step is etching the epitaxial layer 20 along a transverse direction thereof (i.e., a vertical direction as viewed from FIG. 2) to divide the epitaxial layer 20 into a plurality of LED chips 30. The LED chips 30 are spaced from each other. A groove 31 is defined between each two adjacent LED chips 30.

Figure 3:
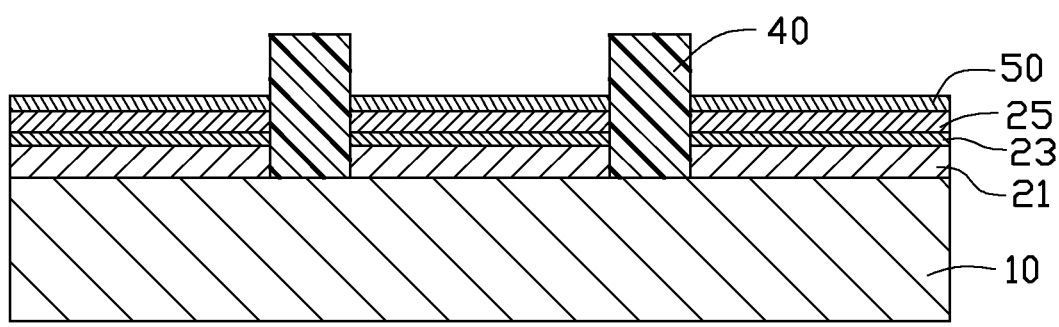

Referring to FIG. 3, the third step is providing a plurality of insulating poles 40 and inserting the insulating poles 40 in the grooves 31 correspondingly. A bottom end of each insulating pole 40 fills in a corresponding groove 31 and connects the adjacent LED chips 30. A top end of each insulating pole 40 is higher than a top of the P-type semiconductor layer 25 of each LED chip 30. In this embodiment, the insulating pole 40 is a photo-resistor and can withstand heat to 180 degrees centigrade.

The fourth step is plating a blocking layer 50 on a top surface of each P-type semiconductor layer 25 away from the active layer 23. The blocking layer 50 is a nickel (Ni) layer and completely covers the top surface of the P-type semiconductor layer 25 to prevent other material from penetrating into the LED chip 30 from the top surface of the P-type semiconductor layer 25.

Figure 4:
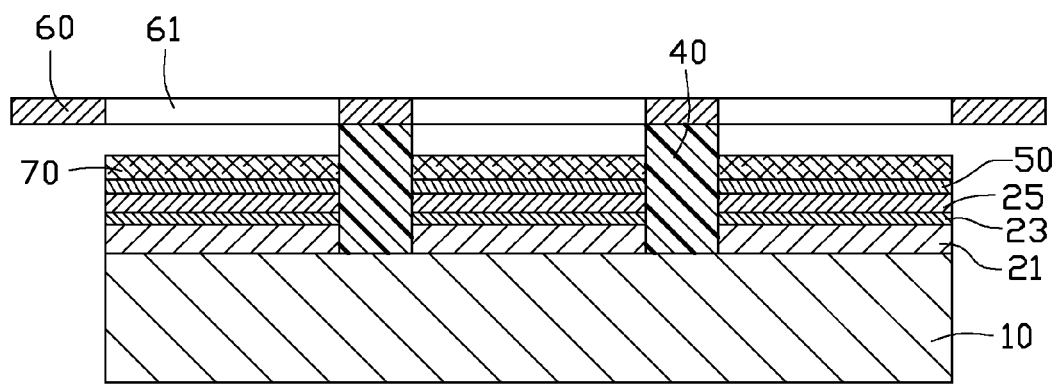

Referring to FIG. 4, the fifth step is providing a printing template 60 and mounting the printing template 60 on the insulating poles 40. The printing template 60 is made of steel. A plurality of openings 61 are defined in the printing template 60. The printing template 60 is arranged on top ends of the insulating poles 40 and covers the top ends of the insulating poles 40. An outer periphery of the printing template 60 extends around a periphery of the sapphire substrate 10. The openings 61 of the printing template 60 align in a one-to-one relation with the blocking layers 50 of the LED chips 30 to expose the blocking layers 50.

The sixth step is printing a solder paste layer 70 on each blocking layer 50 from the opening 61 of the printing template 60 and then removing the printing template 60 after the printing of the solder paste layers 70 is completed.

Figure 5:
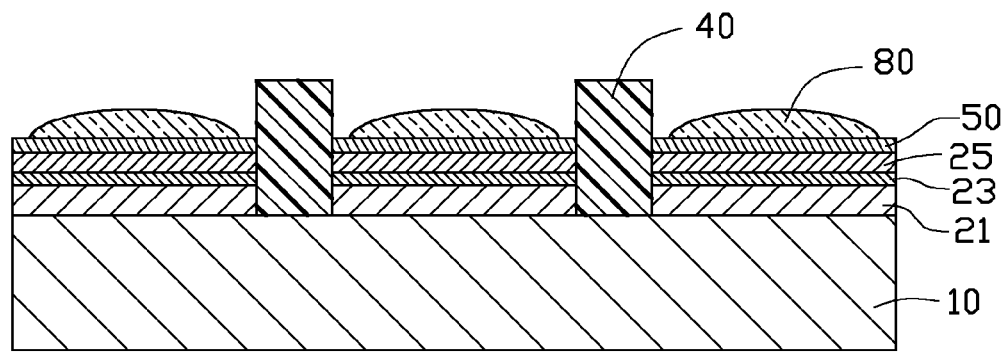

Referring to FIG. 5, the seventh step is reflow soldering the LED chips 30 under 180 degrees centigrade to 250 degrees centigrade until the solder paste layers 70 mounted on the LED chips 30 form solder balls 80.

Figure 6:
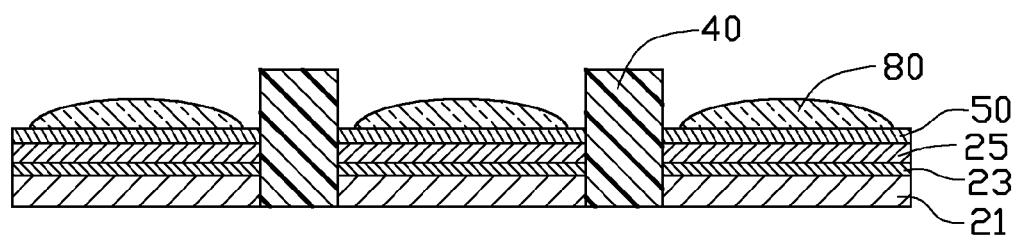

Referring to FIG. 6, the eighth step is heating the sapphire substrate 10 by laser to make the sapphire substrate 10 released from the LED chips 30.

Figure 7:
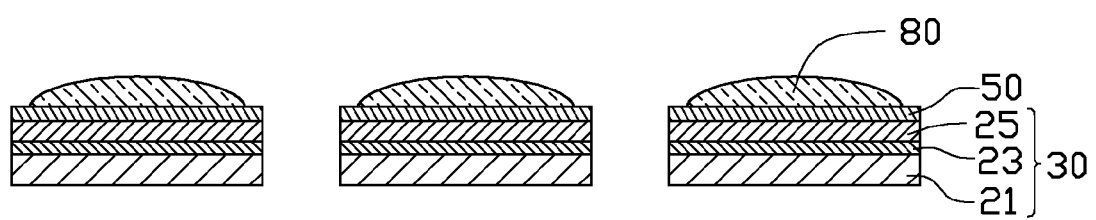

Referring to FIG. 7, the ninth step is etching the insulating poles 40 by alkaline solution or acidic solution under 100 degrees centigrade until the insulating poles 40 dissolve in alkaline solution or acidic solution. In this state, the LED chips 30 are separated from each other.

Figure 8:
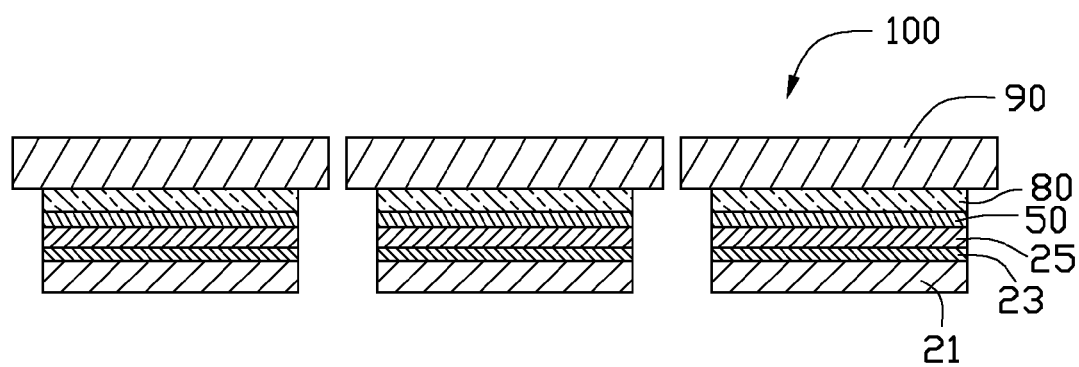

Referring to FIG. 8, the tenth step is providing a plurality of metallic plates 90 and respectively soldering the metallic plates 90 on the solder balls 80 of the LED chips 30 under 300 degrees centigrade. Thus, the LEDs 100 are obtained.

It is understood that, in this embodiment, the separated LED chips 30 directly engage with the separated metallic plates 90, therefore a step of severing a metallic plate into a plurality of parts by laser wherein the metallic parts respectively engage with the LED chips is avoid. Thus, a cost for manufacturing the LEDs 100 is decreased.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing LEDs (light emitting diodes) comprising following steps:

providing a substrate and an epitaxial layer formed on a side of the substrate;

etching the epitaxial layer along a transverse direction of the epitaxial layer to divide the epitaxial layer into a plurality of separated LED chips, and a groove defined between each two adjacent LED chips;

providing a plurality of insulating poles and inserting the insulating poles in the grooves;

coating a blocking layer on a top surface of each LED chip away from the substrate;

printing a solder paste layer on a top surface of each blocking layer away from the epitaxial layer;

reflow soldering the LED chips to make the solder paste layers mounted on the LED chips become solder balls;

releasing the substrate from the LED chips;

etching the insulating poles until the insulating poles are totally removed and the LED chips are separated from each other; and providing a plurality of metallic plates and respectively soldering the metallic plates on the solder balls of the LED chips.

2. The method as claimed in claim 1, wherein a bottom end of each insulating pole fills in a corresponding groove and connects the adjacent LED chips.

3. The method as claimed in claim 1, wherein the insulating pole is a photo-resistor and can withstand heat to 180 degrees centigrade.

4. The method as claimed in claim 1, wherein the step of reflow soldering the LED chips is performed under a temperature of 180 degrees centigrade to 250 degrees centigrade.

5. The method as claimed in claim 1, wherein the insulating poles are etched by alkaline solution or acidic solution.

6. The method as claimed in claim 5, wherein the insulating poles are etched under a temperature of 100 degrees centigrade.

7. The method as claimed in claim 1, wherein the metallic plates and the LED chips are soldered together under a temperature of 300 degrees centigrade.

8. The method as claimed in claim 1, wherein the blocking player is formed on the epitaxial layer by plating.

9. The method as claimed in claim 8, wherein the blocking layer is a nickel (Ni) layer.

10. The method as claimed in claim 8, wherein the blocking layer completely covers the top surface of the LED chip.

11. The method as claimed in claim 1, wherein during the step of printing the solder paste layers on the blocking layers, a printing template with a plurality of openings is provided to cover the insulating poles, and the openings align in a one-to-one relation with the blocking layers of the LED chips to expose the blocking layers, and the solder paste layers are applied to the blocking layers through the openings.

12. The method as claimed in claim 1, wherein the epitaxial layer comprises an N-type semiconductor layer, an active layer and a P-type semiconductor layer arranged on the sapphire substrate in sequence.

13. A method for manufacturing LEDs (light emitting diodes) comprising following steps:

providing a substrate and an epitaxial layer formed on a side of the substrate;

etching the epitaxial layer along a transverse direction of the epitaxial layer to divide the epitaxial layer into a plurality of separated LED chips, and a groove defined between each two adjacent LED chips;

providing a plurality of insulating poles and inserting the insulating poles in the grooves;

printing a solder paste layer on a top surface of each LED chip away from the substrate;

reflow soldering the LED chips to make the solder paste layers mounted on the LED chips become solder balls;

releasing the substrate from the LED chips by heating the substrate by laser;

etching the insulating poles until the insulating poles are totally removed and the LED chips are separated from each other; and providing a plurality of metallic plates and respectively soldering the metallic plates on the solder balls of the LED chips.

14. The method as claimed in claim 13, wherein each insulating pole fills in a corresponding groove and connects the adjacent LED chips.

15. The method as claimed in claim 13, wherein the insulating pole is a photo-resistor and can withstand a heat of 180 degrees centigrade.

16. The method as claimed in claim 13, wherein the step of reflow soldering the LED chips is performed under a temperature of 180 degrees centigrade to 250 degrees centigrade.

17. The method as claimed in claim 13, wherein the insulating poles are etched by alkaline solution or acidic solution.

18. The method as claimed in claim 17, wherein the insulating poles are etched under 100 degrees centigrade.

* * * * *